July 25, 1967 J. O. ISRAEL 3,333,215

VOLTAGE-SENSITIVE SEMICONDUCTOR CIRCUIT FOR PROVIDING IMPROVED SWEEP FREQUENCY LINEARITY

Filed Nov. 3, 1964

INVENTOR
J. O. ISRAEL

BY R. O. Nimz

ATTORNEY

United States Patent Office 3,333,215
Patented July 25, 1967

3,333,215

VOLTAGE-SENSITIVE SEMICONDUCTOR CIRCUIT FOR PROVIDING IMPROVED SWEEP FREQUENCY LINEARITY

John O. Israel, West Orange, N.J., assignor to Bell Telephone Laboratories, Incorporated, New York, N.Y., a corporation of New York Filed Nov. 3, 1964, Ser. No. 408,643
9 Claims. (Cl. 334—15)

This invention relates to resonant circuits which are tuned by changing the value of an applied voltage, and more particularly to resonant circuits which utilize a back-biased semiconductor diode as the tuning element.

A semiconductor diode, known as a varactor exhibits a change in capacitance with a change in the value of applied back-bias potential. This type of diode has been frequently used in the resonant circuit of a sweep generator to provide a sweep frequency output by varying the back-bias potential of the diode in accordance with a sweep voltage. In sweep generators that are to be used for investigative purposes, it is advantageous to have the output sweep frequency linear with respect to time in order that each segment of the frequency range receive an equal amount of energy, thereby permitting the detection of the same degree of irregularity in the device under investigation throughout the entire frequency range. It is also advantageous to have a sweep voltage which is linear with respect to time as it can then be used to provide the X-axis sweep of an oscilloscope on which equal units on the X-axis correspond to equal increments in the sweep frequency range. Unfortunately, the relationship between the back-bias voltage and the resonant frequency of a single diode in parallel with an L-C (inductance and capacitance) combination is not linear. Consequently, simply applying a linear sweep voltage to a single diode in parallel with an L-C combination will not result in a linear sweep frequency.

An object of the present invention is to provide a circuit which produces a frequency sweep of improved linearity in response to a linear sweep voltage.

Another object of the present invention is to provide a circuit which produces a linear frequency sweep and utilizes back-biased semiconductor diodes.

These and other objects are attained in accordance with the present invention wherein the capacitive portion of a resonant circuit includes two back-biased semiconductor diodes each of which presents a capacitance which is dependent on the value of reverse bias voltage applied to it. The full range of applied linear sweep voltage is allowed to change the capacitance of one diode, whereas a third clamping diode prevents the sweep voltage from completely driving the other of said two diodes toward its highest values of capacitance. As a result, the change in frequency per change in voltage is more nearly a constant throughout the entire sweep voltage range.

Figure 1:
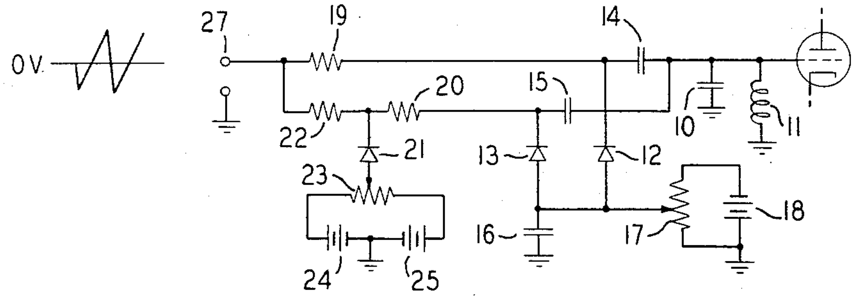
Figure 2:
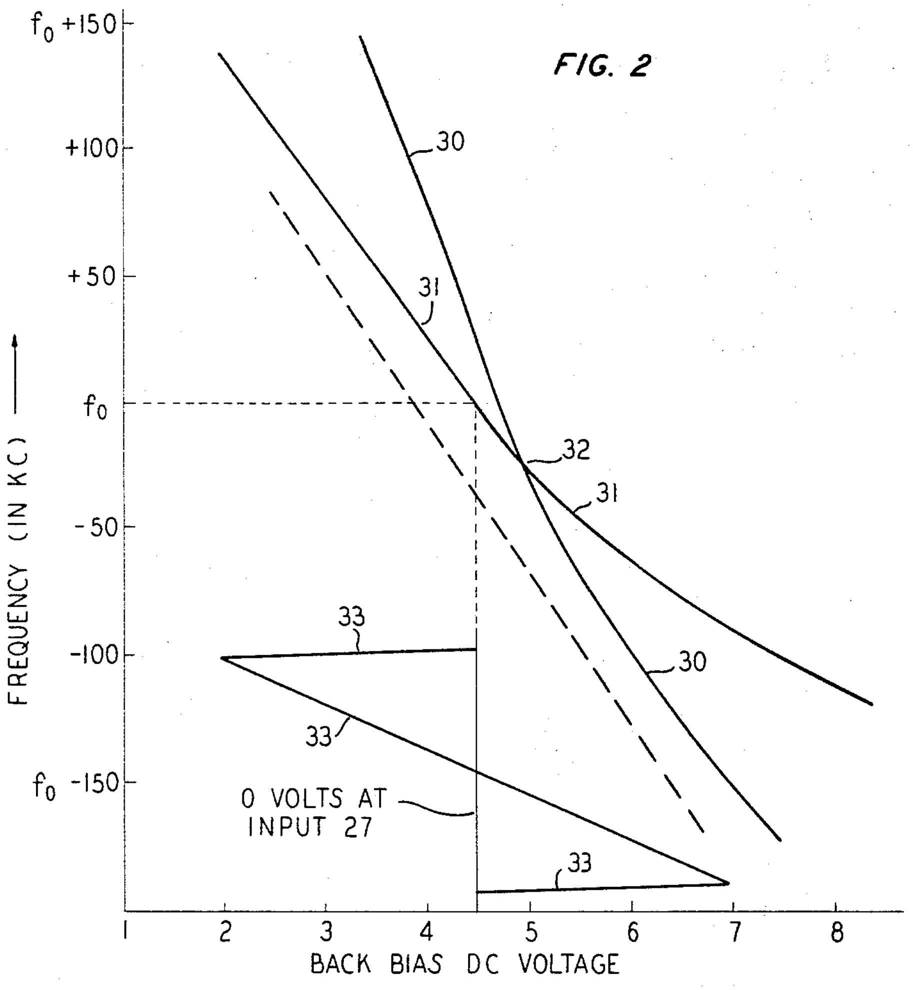

Other objects and many of the attendant advantages of the invention will be readily appreciated as the same becomes better understood by reference to the following detailed description when considered in connection with the accompanying drawings in which:

FIG. 1 is the schematic diagram of a circuit which utilizes the present invention; and FIG. 2 is a graph which is useful in explaining the operation of the present invention.

Referring now to FIG. 1, capacitor 10 and inductor 11 represent the fixed elements in a parallel L-C resonant circuit of a sweep generator. Although either of these elements may be varied in order to change the frequency about which sweeping takes place, they are both fixed in that neither element changes in response to an applied sweep voltage. In addition to capacitor 10, the capacitive portion of the resonant circuit includes the back-biased diodes, varactors 12 and 13, connected in parallel with capacitor 10 through coupling capacitors 14, 15, and 16 all of which have substantially zero impedance at the resonant frequency. Capacitors 14 and 15 prevent the sweeping voltage which is applied to the cathodes of varactors 12 and 13 from being short-circuited to ground through inductor 11; capacitor 16 couples the anodes of varactors 12 and 13 to the reference potential side of the resonant circuit. Hence the entire AC resonant circuit consists of capacitor 10 and inductor 11 in parallel with the capacitance of varactors 12 and 13.

The linear sweep voltage which is utilized to produce the linear frequency sweep is applied from an external source between input 27 and ground. Although a sawtooth wave having its median value about zero volts is shown, other voltage waveforms such as a triangular wave shape or even individual discrete values of voltage may be utilized. The linear sweep voltage is connected from input 27 to the cathode of varactor 12 through resistor 19 which is sufficiently high in value that the low impedance of the linear sweep voltage source does not cause any significant loading of the resonant circuit. Even though resistor 19 is high in value, substantially all of the linear sweep voltage will appear at the cathode of varactor 12 since the impedance to ground at sweep frequencies presented by capacitor 14 and varactor 12 is much larger than resistor 19. The cathode of varactor 13 is connected to input 27 through resistors 20 and 22. Resistor 20 like resistor 19 is sufficiently high in value such that the circuits on the sweep voltage side of resistor 20 will not cause any significant loading of the resonant circuit. Resistor 22 is also high in value in order to prevent any significant loading of the applied input voltage generator during the period of time when diode 21 is clamping, i.e., in conduction, as will hereinafter be described.

The anodes of varactors 12 and 13 are connected together to the tap on potentiometer 17 which provides a negative potential by virtue of the current which flows from potential source 18 through potentiometer 17 to ground. The potential on the anodes of varactors 12 and 13 is set by way of potentiometer 17 to be sufficiently negative such that the varactors will not be forward-biased. It should be noted that this potential must exceed the maximum negative potential of the linear sweep voltage by at least the peak value of AC signal which appears across capacitor 10 and inductor 11 when oscillations are present.

In order to understand the operation of the circuit of FIG. 1, it is helpful to refer to the curves shown in FIG. 2. To facilitate an understanding of the existing relationships between the applied sweep voltage and the biasing potentials, voltage values are indicated in FIG. 2 and will be referred to in the discussion. It is to be understood, however, that the particular values chosen are for illustrative purposes only, and their absolute magnitudes are in no way critical.

Assuming for the moment that diode 21 and its associated circuitry is not connected to the junction of resistors 20 and 22, the full range of sweep voltage which is applied to input 27 would also appear across varactors 12 and 13. Referring now to FIG. 2, curve 30 shows the change in resonant frequency which would occur by varying the back-bias voltage across two Varicaps in parallel with an L-C resonant circuit. It can easily be seen that the slope of the curve is not constant as is necessary in order to have a linear sweep frequency produced in response to a linear variation in back-bias voltage.

Assume now that resistor 20 is removed thereby preventing the application of the sweep voltage at input 27 to varactor 13. Curve 31 in FIG. 2 shows the change in resonant frequency which would occur by varying the back-bias voltage across a single Varicap in parallel with an L-C resonant circuit. If the back-bias potential on the anode of Varicap 13 is set at about five volts, curves 30 and 31 intersect as shown at point 32. Here again, as in the case of curve 30, the slope of curve 31 is not constant as desired.

A close approximation to linearity could be obtained, however, from a circuit which would follow the single Varicap curve 31 for back-bias voltages up to point 32 and then follow double Varicap curve 30 for back-bias voltages beyond point 32. This is precisely the curve which is followed by the complete circuit shown in FIG. 1.

Returning now to FIG. 1, diode 21 has its cathode connected to the junction of resistors 20 and 22, and its anode connected to the tap on potentiometer 23 which provides a changeable DC potential of either polarity by virtue of the current which flows from positive potential source 24 through potentiometer 23 to negative potential source 25. Potentiometer 23 has a much lower resistance value than resistor 22, and therefore diode 21, when in conduction, acts as a clamp in preventing the sweep voltage at input 27 from driving the potential on the cathode of varactor 13 more negative than the potential on the anode of diode 21. Potentiometer 23 is adjusted to provide the particular potential at which diode 21 will clamp and thereby prevent the back-bias voltage on varactor 13 from being driven any lower than the back-bias voltage at point 32 in FIG. 2.

For example, assume that potentiometer 17 has been adjusted to provide a negative potential of 4.5 volts to the cathodes of varactors 12 and 13. This would allow a sweep voltage having a peak-to-peak value of five volts and a median value of zero volts to be applied to input 27 without causing the varactors to be forward-biased even in the presence of oscillations across the resonant circuit which have a peak voltage value of less than two volts. Curve 33 in FIG. 2 illustrates one complete cycle of this sweep voltage, and the X-axis projection of curve 33 gives the values of DC back-bias voltage on varactor 12 for any point in the cycle. Potentiometer 23 is adjusted to provide a potential to the anode of diode 21 equal to the back-bias potential at point 32 minus the magnitude of the back-bias potential which is obtained across the varactors when input 27 is at zero volts. For the curves shown in FIG. 2, this provided potential is equal to 5 volts minus 4.5 volts or 0.5 volt. As a result, the sweep voltage illustrated as curve 33 in FIG. 2 for values more positive than +0.5 volt at input 27 will cause the back-bias voltage on both varactors to change, and the resonant frequency will follow curve 30. Whereas for values more negative than +0.5 volt at input 27, the sweep voltage will cause the back-bias voltage only on varactor 12 to change (the voltage on varactor 13 being clamped by diode 21), and the resonant frequency will follow curve 31. Accordingly, a more linear frequency sweep is obtained in response to a linear sweep voltage.

As was mentioned hereinbefore, the particular values chosen are in no way critical. Even point 32, the potential at which clamping is advantageously set to occur, will depend on the type of varactor chosen. For any given varactor, however, point 32 can be graphically determined by sliding the frequency scale of a plot of double varactor curve 30 relative to a plot of single varactor curve 31 until the low voltage segment of curve 31 and the high voltage segment of curve 30 provide the best approximation to linearity.

In many applications, changeable potentials at both the anode of diode 21 and the anodes of varactors 12 and 13 may not be necessary. For example, if the back-bias DC voltage on varactors 12 and 13 is equal to the potential at point 32 when the sweep voltage at input 27 is equal to zero volts, then a potential of zero volts is required on the anode of diode 21 and the latter may therefore be connected directly to ground. On the other hand, if the median value of the linear sweep voltage at input 27 is positive and equal to the potential at point 32, the anodes of varactors 12 and 13 may be connected to ground and the anode of diode 21 to a positive potential equal to the median value of the sweep voltage. Many other variations in supply potentials and sweep voltage are of course possible, so long as the input voltage is prevented from driving varactor 13 to its highest values of capacitance.

What has been described hereinbefore is a specific illustrative embodiment of the principles of the present invention. It is to be understood that numerous other arrangements to physical parts and different components may be utilized with equal advantage. For example, diode 21 and varactors 12 and 13 may be reversed in polarity with corresponding reversals in the polarity of the applied back-bias potentials. In addition, it should be noted that the invention is not restricted to application in sweep generators and may be utilized with equal advantage in any situation where the change in resonant frequency of a tank circuit for a given change in voltage is desired to be a constant throughout the entire applied voltage range.

Accordingly, it is to be understood that the above-described arrangement is merely illustrative of the application of the principles of the present invention and numerous modifications thereof may be devised by those skilled in the art without departing from the spirit and scope of the invention.

What is claimed is:

1. A circuit for providing a frequency sweep of improved linearity in response to an input linear sweep voltage comprising a resonant circuit having in a parallel branch thereof first and second back-biased semiconductor diodes each presenting a capacitance which is dependent on the value of reverse bias voltage applied to it, first means for applying the full range of the linear sweep voltage to said first diode, second means for applying the sweep voltage to said second diode including diode clamping means for preventing the sweep voltage from driving said second diode toward its highest values of capacitance.

2. A circuit as defined in claim 1 wherein said first means includes a first resistor means connected between the input and one electrode of said first diode, said second means includes a second and third resistor means in series connection between the input and one electrode of said second diode, and the junction of the second and third resistor means is connected to one electrode of said diode clamping means.

3. A circuit as defined in claim 2 wherein a source of back-bias potential is applied to the other electrode of the first and second semiconductor diodes.

4. A circuit as defined in claim 2 wherein said diode clamping means includes a bias potential source for setting the potential beyond which the sweep voltage is prevented from changing the capacitance of said second semiconductor diode.

5. A circuit which provides a substantially constant ratio of change in resonant frequency to change in input voltage throughout a range of applied input voltages comprising a resonant circuit having in a parallel branch thereof first and second back-biased varactors, a first means for connecting the input voltage to one electrode of said first varactor, second means for connecting the input voltage to one electrode of said second varactor including clamping diode means for preventing the second varactor from being driven by the input voltage below a predetermined value of back-bias potential, the poling of the clamping diode with respect to the input being the same as the second varactor, and a bias potential source connected between a reference potential and the other electrodes of said first and second varactor for back biasing the varactors.

6. A circuit as defined in claim 5 wherein said second means includes a first and second resistor in series connection between the input and said one electrode of the second varactor, and the junction of said first and second resistor is connected to one electrode of said clamping diode means.

7. A circuit as defined in claim 6 wherein the other electrode of said clamping diode means is connected to the reference potential.

8. A circuit as defined in claim 6 wherein a bias potential source is connected between the other electrode of said clamping diode means and the reference potential.

9. Means for tuning a parallel resonant circuit in accordance with an applied voltage comprising at least two semiconductor devices connected across said resonant circuit and having voltage-dependent reactance characteristics, means for impressing a first range of said applied voltage on a selected one of said devices, and means for impressing a second and substantially different range of said applied voltage on a different one of said devices.

References Cited

UNITED STATES PATENTS 3,219,944 11/1965 Krausz et al. ---------- 331—36

FOREIGN PATENTS 1,319,107 1/1963 France.

ELI LIEBERMAN, *Primary Examiner.*

M. NUSSBAUM, *Assistant Examiner.*